(12) United States Patent
Fuller et al.

(10) Patent No.: US 8,199,866 B2
(45) Date of Patent: Jun. 12, 2012

(54) EDGE-BASED SAMPLER OFFSET CORRECTION

(75) Inventors: Andrew M. Fuller, Chapel Hill, NC (US); John Poulton, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 12/525,044

(22) PCT Filed: Feb. 11, 2008

(86) PCT No.: PCT/US2008/053552
§ 371 (c)(1),
(2), (4) Date: Mar. 25, 2010

(87) PCT Pub. No.: WO2008/100843
PCT Pub. Date: Aug. 21, 2008

(65) Prior Publication Data
US 2010/0220828 A1 Sep. 2, 2010

Related U.S. Application Data

(60) Provisional application No. 60/900,804, filed on Feb. 12, 2007.

(51) Int. Cl.
*H04L 7/00* (2006.01)
(52) U.S. Cl. ...................................................... 375/355
(58) Field of Classification Search .................. 375/355, 375/359, 360, 371, 373
See application file for complete search history.

(56) References Cited

U.S. PATENT DOCUMENTS 6,473,131 B1 * 10/2002 Neugebauer et al. ......... 348/572
2004/0161068 A1 * 8/2004 Zerbe et al. ................... 375/355
(Continued)

FOREIGN PATENT DOCUMENTS
EP  1225698 A1  7/2002

OTHER PUBLICATIONS

Palmer, R et al., "A 14 mW 6.25Gb/s Transceiver in 90mm COMS for Serial Chip-to Chip Communications", IEEE international solid-state circuits conference (ISSCC), Digest of Technical Papers, Conference held in San Francisco, CA, USA, Feb. 11, 2007.

(Continued)

*Primary Examiner* — Jaison Joseph
(74) *Attorney, Agent, or Firm* — Park, Vaughan, Fleming & Dowler LLP

(57) ABSTRACT

Embodiments of a circuit are described. This circuit includes a receiver circuit including a first sampler (312-1) and a second" sampler (312-2). A clock-data-recovery circuit (324) in the receiver circuit adjusts a sample time of the receiver circuit so that the sample time is proximate to a signal crossing point at an edge of an eye pattern associated with received signals. An offset-calibration circuit (326) in the receiver circuit determines and adjusts an offset voltage of a given sampler, which can be the first sampler or the second sampler. This offset-calibration circuit may determine a present offset voltage (412) of the given sampler in a timing region proximate to the signal crossing point (410-2) in which the clock-data-recovery circuit dithers about a present sample time based on the present offset voltage. Additionally, the clock-data-recovery circuit and the offset-calibration circuit may iteratively converge on the signal crossing point and a residual offset voltage of the given sampler.

24 Claims, 11 Drawing Sheets

U.S. PATENT DOCUMENTS

| | | |
|---|---|---|
| 2005/0058234 A1 | 3/2005 | Stojanovic |
| 2005/0069067 A1* | 3/2005 | Zerbe et al. ............... 375/353 |
| 2005/0218986 A1* | 10/2005 | Garlepp et al. ............ 330/259 |
| 2005/0238092 A1* | 10/2005 | Ng .............................. 375/224 |
| 2006/0069967 A1* | 3/2006 | Almy et al. ................. 714/724 |
| 2006/0132339 A1* | 6/2006 | Alon et al. .................. 341/120 |
| 2006/0280272 A1* | 12/2006 | Stojanovic ................. 375/355 |
| 2007/0006054 A1* | 1/2007 | Fiedler ........................ 714/709 |
| 2007/0205818 A1* | 9/2007 | Fiedler ........................ 327/217 |

OTHER PUBLICATIONS

Savoj B. et al., "High-speed CMOS Circuits for Optical Receivers", 2001, Springer, Heidelberg (DE), XP002306705, pp. 13-50.

* cited by examiner

```
                                    ┌─ 600
┌─────────────────────────────────────────────────────────────┐
│ ADJUST A SAMPLE TIME OF A RECEIVER CIRCUIT USING A CLOCK-DATA- │
│ RECOVERY TECHNIQUE SO THAT A SAMPLE TIME OF THE RECEIVER CIRCUIT │
│ IS PROXIMATE TO A SIGNAL CROSSING POINT AT AN EDGE OF AN EYE │
│ PATTERN ASSOCIATED WITH SIGNALS RECEIVED BY THE RECEIVER CIRCUIT, │
│ WHERE THE RECEIVER CIRCUIT INCLUDES A FIRST SAMPLER AND A SECOND │
│                           SAMPLER                            │
│                             610                              │
└─────────────────────────────────────────────────────────────┘
                              │
                              ▼
┌─────────────────────────────────────────────────────────────┐
│ DETERMINE A PRESENT OFFSET VOLTAGE OF A GIVEN SAMPLER, WHICH CAN │
│ BE THE FIRST SAMPLER OR THE SECOND SAMPLER, IN A TIMING REGION │
│ PROXIMATE TO THE SIGNAL CROSSING POINT IN WHICH THE CLOCK-DATA- │
│ RECOVERY TECHNIQUE DITHERS ABOUT A PRESENT SAMPLE TIME BASED ON │
│                   THE PRESENT OFFSET VOLTAGE                 │
│                             612                              │
└─────────────────────────────────────────────────────────────┘
                              │
                              ▼
┌─────────────────────────────────────────────────────────────┐
│ ITERATIVELY CONVERGE ON THE SIGNAL CROSSING POINT AND A RESIDUAL │
│            OFFSET VOLTAGE OF THE GIVEN SAMPLER               │
│                             614                              │
└─────────────────────────────────────────────────────────────┘
```

FIG. 6

EDGE-BASED SAMPLER OFFSET CORRECTION

TECHNICAL FIELD

The present embodiments relate to receiver circuits. More specifically, the present embodiments relate to circuits and methods for determining and correcting an offset-voltage in a receiver circuit.

BRIEF DESCRIPTION OF THE FIGURES

FIG. 6 is a flow chart illustrating an embodiment of a process for calibrating a receiver circuit.

Note that like reference numerals refer to corresponding parts throughout the drawings.

DETAILED DESCRIPTION

Figure 1:
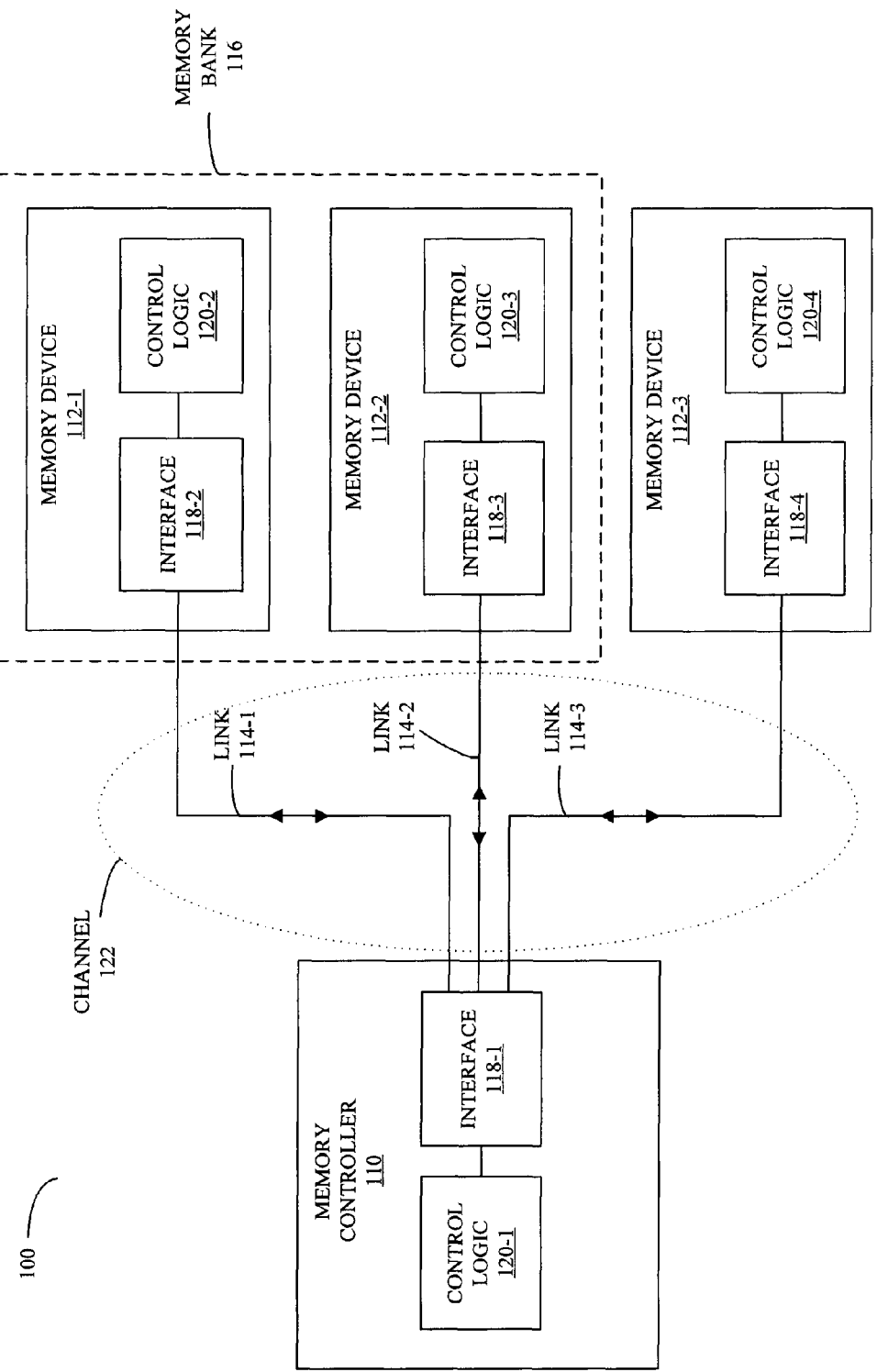
FIG. 1 is a block diagram illustrating an embodiment of a memory system.

The following description is presented to enable any person skilled in the art to make and use the disclosed embodiments, and is provided in the context of a particular application. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Embodiments of a circuit, a memory device that includes the circuit, a memory controller that includes the circuit, a system that includes a transmitter (such as the memory controller) and a receiver (such as the memory device), and a technique for calibrating an offset voltage (for voltage mode) and/or an offset current (for current mode) of a receiver circuit are described. In some embodiments, the circuit is an integrated circuit disposed on a semiconductor die. Moreover, note that the calibration technique may be implemented using hardware and/or software (such as firmware). While memory systems are used as an illustrative example in the following embodiments, note that the calibration technique may be used in a wide variety of applications that include serial and/or parallel links, including inter-chip and intra-chip communication. Moreover, while calibration of one or more offset voltages are used as an illustrative example in the following embodiments, the calibration technique may be used to calibrate one or more offset currents.

In the calibration technique, a clock-data-recovery (CDR) circuit (which may implement an early/late CDR technique) and an offset-calibration circuit are used to determine and adjust an offset voltage of a given sampler in the receiver. In particular, sample times of samples taken by a pair of samplers may be adjusted using the CDR circuit so that the sample time is proximate to a signal crossing point at an edge of an eye pattern associated with signals received by the receiver. Next, the offset-calibration circuit may be used to determine and adjust the offset voltage of the given sampler in a timing region proximate to the signal crossing point in which the CDR circuit dithers about a present sample time based on the present offset voltage. In this way, the CDR circuit and the offset-calibration circuit can iteratively converge on the signal crossing point and a residual offset voltage of the given sampler.

In some embodiments, the offset voltage is determined during a calibration operation mode, during which the received signals include a training pattern. For example, the offset voltage may be calibrated during initial startup (which is sometimes referred to as a startup calibration mode) or as needed (such as when there is degradation in a performance metric during communication between circuits or devices. However, in some embodiments the offset voltage is determined during a normal operation mode using live data (which is sometimes referred to as a real-time calibration mode). For example, an additional pair of samplers in the receiver, which have sample times which are independent of those of the pair of samplers, may sample the signals proximate to a center of the eye pattern (where there is significant timing margin). Based on these samples, control logic in the circuit may identify a particular data pattern in the signals, and samples of this data pattern may be taken by the pair of samplers and used to determine and adjust the offset voltage of the given sampler. Subsequently, the roles of the two pairs of samplers may be reversed (for example, by adjusting the phase of the sampling times of the pair of samplers and the additional pair of samplers), thereby facilitating calibration of the offset voltages of the samplers in the additional pair of samplers.

Note that the control logic may subsequently select another sampler for offset-voltage calibration. In this way, the offset voltages of all of the samplers in the receiver may be sequentially determined and adjusted.

In the illustrated embodiments, one or more of these circuits, integrated circuits, devices, systems and/or techniques may be used in memory systems and/or memory devices that include different types of memory, such as: volatile memory, non-volatile memory, erasable programmable read-only memory (EPROM), electrically erasable programmable read-only memory (EEPROM), NAND or NOR Flash, a fully buffered NAND Flash memory module, solid-state memory, and/or another type of memory. Moreover, for a given type of memory, these techniques may be used in different memory technologies or technology generations (which may use different power-supply voltages).

Components (such as a memory controller, a memory device, a memory module, and/or a memory system) that use these techniques may be included in a wide variety of applications, such as: desktop or laptop computers, computer systems, hand-held or portable devices (such as personal digital assistants and/or cellular telephones), set-top boxes, home networks, and/or video-game devices. For example, a storage device (such as the memory module) may be included in computer main memory. Moreover, one or more of these embodiments may be included in a communication system, such as: serial or parallel links, metropolitan area networks (such as WiMax), local area networks (LANs), wireless local area networks (WLANs), personal area networks (PANs), and/or wireless personal area networks (WPANs).

We now describe embodiments of a circuit that calibrates one or more offset voltages of a receiver circuit, and devices and systems that include the circuit and the receiver circuit. In receiver circuits, there is typically an offset voltage in a threshold voltage between two outputs (such as a logical '0' and a logical '1') of a sampler. For example, this offset voltage may be associated with transistor mismatch. Unfortunately, as transistor dimensions are scaled mismatch can have a larger impact on performance. Moreover, this performance impact may increase as voltage signal levels decrease. Consequently, in order to have sufficient voltage margin, it is becoming increasingly important to effectively and efficiently determine and compensate for the offset voltage. Note that the offset voltage may vary as a function of: the operating point of the receiver circuit, the temperature, the supply voltage, and/or the frequency content of the received signals.

FIG. 1 presents a block diagram illustrating an embodiment of a memory system 100. This memory system includes at least one memory controller 110 and one or more memory devices 112, such as one or more memory modules. In some embodiments, the memory controller 110 is a local memory controller and/or is a system memory controller (which may be implemented in a microprocessor).

Memory controller 110 may include an I/O interface 118-1 and control logic 120-1. Control logic 120-1 may be used to encode data for transmission by the interface 118-1 to one or more of the memory devices 112 and/or to decode data received by the interface 118-1 from one or more of the memory devices 112 (for example, using a modulation code).

In some embodiments, one or more of memory devices 112 include control logic 120 and at least one of interfaces 118. Note that in some embodiments two or more of the memory devices 112, such as memory devices 112-1 and 112-2, may be configured as a memory bank 116.

Figure 2A:
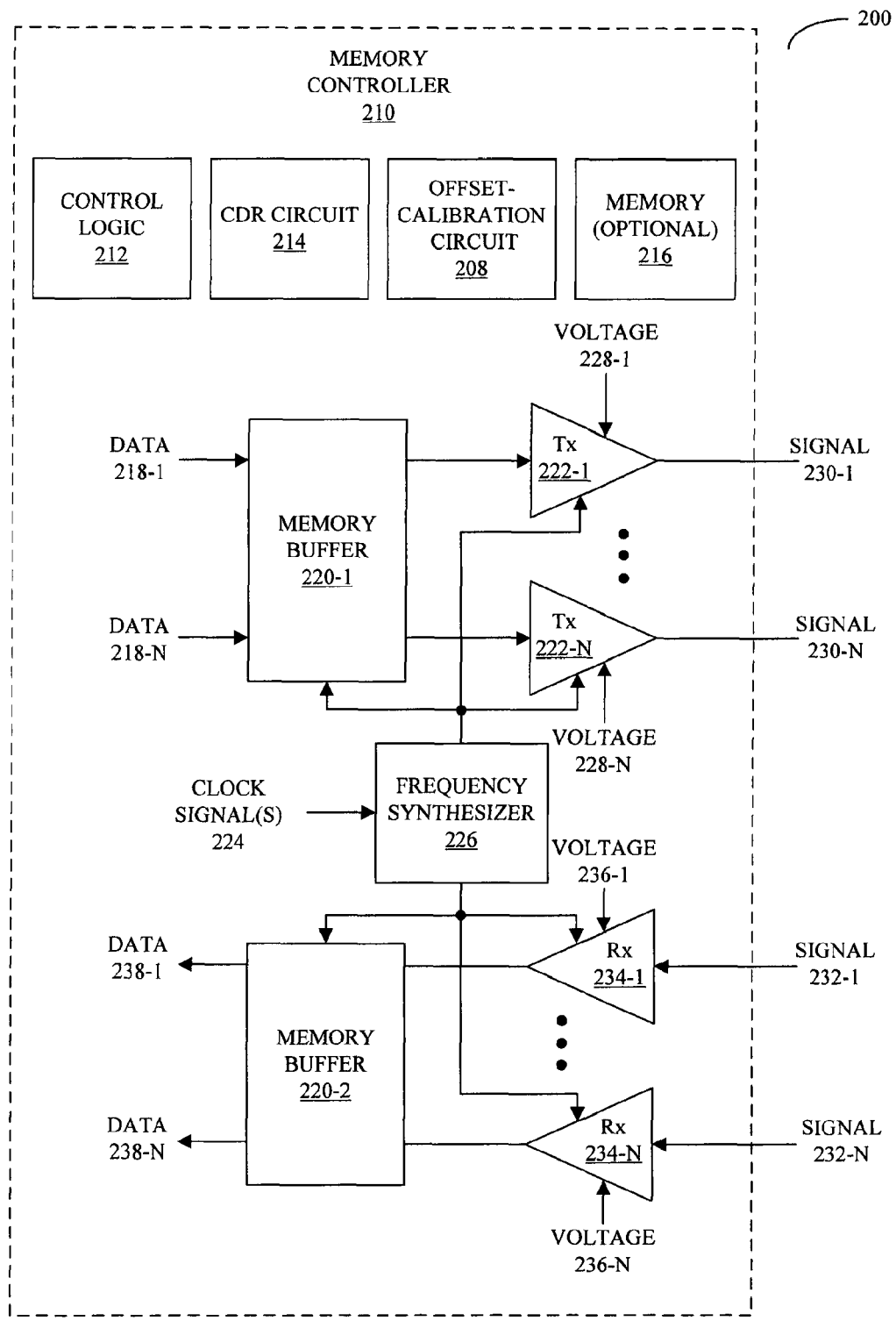
FIG. 2A is a block diagram illustrating an embodiment of a memory controller.
Figure 2B:
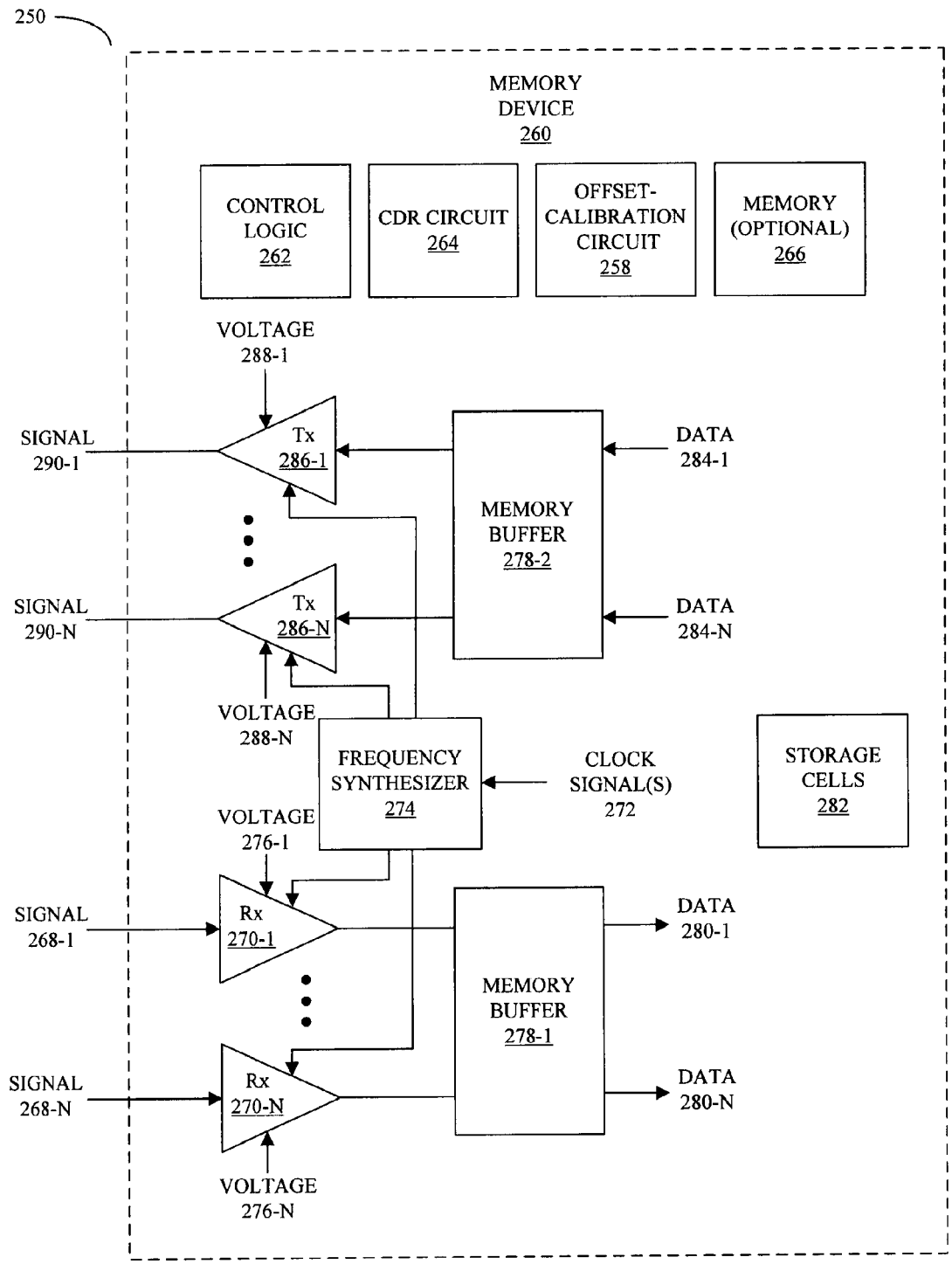
FIG. 2B is a block diagram illustrating an embodiment of a memory device.

Memory controller 110 and memory devices 112 are coupled by one or more links 114 in a channel 122. These links may include: wired, wireless and/or optical communication. Moreover, links 114 may be used for bi-directional and/or uni-directional communications between the memory controller 110 and one or more of the memory devices 112. For example, bi-directional communication between the memory controller 110 and a given memory device may be simultaneous (full-duplex communication). Alternatively, the memory controller 110 may transmit information (such as a data packet which includes a command) to the given memory device, and the given memory device may subsequently provide requested data to the memory controller 110, e.g., a communication direction on one or more of the links 114 may alternate (half-duplex communication). Note that one or more of the links 114 and corresponding transmit circuits (which are illustrated in FIGS. 2A and 2B) and/or receiver circuits (which are illustrated in FIGS. 2A and 2B) may be dynamically configured, for example, by one of the control logic 120 circuits, for bi-directional and/or uni-directional communication.

In some embodiments, data may be communicated on one or more of the links 114 using one or more sub-channels associated with one or more carrier frequencies $f_i$. Moreover, a given sub-channel may have an associated: range of frequencies, a frequency band, or groups of frequency bands (henceforth referred to as a frequency band). For example, a baseband sub-channel is associated with a first frequency band, and a passband sub-channel is associated with a second frequency band. Note that, if at least one of the links 114 is AC-coupled, the baseband sub-channel may not contain DC (i.e., does not include 0 Hz).

In some embodiments, frequency bands for adjacent sub-channels may partially or completely overlap, or may not overlap. For example, there may be partial overlap of neighboring frequency bands, which occurs in so-called approximate bit loading. Moreover, in some embodiments signals on adjacent sub-channels may be orthogonal.

Signals carried on these sub-channels may be: time-multiplexed, frequency-multiplexed, and/or encoded. Thus, in some embodiments the signals are encoded using: time-division multiple access, frequency-division multiple access, and/or code-division multiple access. Moreover, in some embodiments signals are communicated on the links 114 using discrete multi-tone communication (such as Orthogonal Frequency-Division Multiplexing).

Moreover, the data communicated on links 114 may be modulation coded. This modulation coding may include spread-spectrum encoding, for example, coding based on: binary pseudorandom sequences (such as maximal length sequences or m-sequences), Gold codes, and/or Kasami sequences. Moreover, modulation coding may include bit-to-symbol coding in which one or more data bits are mapped together to a data symbol, and symbol-to-bit coding in which one or more symbols are mapped to data bits. For example, a group of two data bits can be mapped to: one of four different amplitudes of an encoded data signal; one of four different phases of a sinusoid; or a combination of one of two different amplitudes of a sinusoid and one of two different phases of the same sinusoid (such as in quadrature amplitude modulation or QAM).

In general, the modulation coding may include: amplitude modulation, phase modulation, and/or frequency modulation, such as pulse-amplitude modulation (PAM), pulse-width modulation, and/or pulse-code modulation. For example, the modulation coding may include: two-level pulse-amplitude modulation (2-PAM), three-level pulse-amplitude modulation (3-PAM), four-level pulse-amplitude modulation (4-PAM), eight-level pulse-amplitude modulation (8-PAM), sixteen-level pulse-amplitude modulation (16-PAM), two-level on-off keying (2-OOK), four-level on-off keying (4-OOK), eight-level on-off keying (8-OOK), and/or sixteen-level on-off keying (16-OOK).

In some embodiments, the modulation coding includes non-return-to-zero (NRZ) coding. Moreover, in some embodiments the modulation coding includes two-or-more-level QAM. Note that the different sub-channels communicated on the links 114 may be encoded differently and/or the modulation coding may be dynamically adjusted. As described further below with reference to FIGS. 2A and 2B, this adjustment may be based on a performance metric associated with communication on one or more of the links 114.

While FIG. 1 illustrates memory system 100 having one memory controller 110 and three memory devices 112, other embodiments may have additional memory controllers and fewer or more memory devices 112. Moreover, while memory system 100 illustrates memory controller 110 coupled to multiple memory devices 112, in other embodiments two or more memory controllers may be coupled to one another. Note that memory controller 110 and one or more of the memory devices 112 may be implemented on the same or different integrated circuits, and that these one or more integrated circuits may be included in a chip-package.

In some embodiments, some of the memory devices 112 may not have control logic 120. Moreover, memory controller 110 and/or one or more of memory devices 112 may include more than one of the interfaces 118, and these interfaces may share one or more control logic 120 circuits. Additionally, while memory system 100 illustrates three links 114, other embodiments may have fewer or more links 114.

FIG. 2A presents a block diagram illustrating an embodiment 200 of a memory controller 210, such as memory controller 110 (FIG. 1). During operation, data 218 to be transmitted by the memory controller 210 to a memory device may be temporarily stored in memory buffer 220-1. Then, the data 218 may be forwarded to transmit circuits (Tx) 222, and may be transmitted as (analog or digital) signals 230.

Similarly, signals 232 may be received from the memory device using receiver circuits (Rx) 234, which include detection circuits (such as slicer circuits) to determine data 238 from the signals 232. In some embodiments, data 238 is temporarily stored in memory buffer 220-2.

Note that timing of the forwarding, receiving, and/or transmitting may be gated by one or more timing signals provided by frequency synthesizer 226. Consequently, signals 230 may be transmitted and/or signals 232 may be received based on either or both edges in the one or more timing signals. Moreover, in some embodiments transmitting and receiving may be synchronous and/or asynchronous.

These timing signals may be generated based on one or more clock signals 224, which may be generated on-chip (for example, using a phase-locked loop and one or more reference signals provided by a frequency reference) and/or off-chip. Alternatively, timing signals or clock signals 224 may be recovered from signals 232, for example, using CDR circuit 214. Moreover, voltage levels and/or a voltage swing of the signals 230 may be based on voltages 228 provided by a power supply (not shown), and logic levels of the data 238 may be based on voltages 236 provided by the power supply. These voltages may be fixed or adjustable.

In some embodiments a period of the one or more timing signals, a skew or delay of the one or more timing signals, and/or one or more of the voltages 228 and 236 are adjusted based on a performance metric associated with communication to and/or from the memory controller 210. This performance metric may include: a signal strength (such as a signal amplitude or a signal intensity), a mean square error (MSE) relative to a target (such as a detection threshold, a point in a constellation diagram, and/or a sequence of points in a constellation diagram), a signal-to-noise ratio (SNR), a bit-error rate (BER), a timing margin, and/or a voltage margin.

Memory controller 210 may include CDR circuit 214 and offset-calibration circuit 208 to determine and compensate for offset voltages of one or more samplers in receivers 234 (as described further below with reference to FIGS. 3-5). As noted previously, the offset voltages may be determined and corrected in a calibration operation mode (such as a startup calibration mode) or a normal operation mode (such as a real-time calibration mode). For example, during a calibration operation mode, a transmitter in another device (such as memory device 260 in FIG. 2B) may transmit a training pattern. Alternatively, during a normal operation mode, one or more particular data patterns in signals 232 may be used when determining and calibrating the offset voltages. In some embodiments, control logic 212 is used to: select the operation mode; select the sampler(s) to be calibrated; and/or identify a data pattern in one or more signals 232 that is used when calibrating the offset voltage(s). Note that samples measured by one or more samplers may be stored in optional memory 216.

Moreover, while not shown in FIG. 2A, in some embodiments the memory controller 210 includes one or more additional transmit circuits coupled to a separate command link (or communication channel), which communicate commands to a memory device. This separate link: may be wireless, optical or wired; may have a lower data rate than the data rates associated with one or more of the sub-channels; may use one or more different carrier frequencies than are used in the data sub-channels; and/or may use a different modulation technique than is used in the data sub-channels. However, in some embodiments commands are communicated using one or more of the transmit circuits 222.

FIG. 2B presents a block diagram illustrating an embodiment 250 of a memory device 260, such as memory device 112-1 (FIG. 1). In this memory device, signals 268 are received from another device (such as the memory controller 210 in FIG. 2A) using receiver circuits (Rx) 270. These circuits may include detection circuits (such as slicer circuits) to determine data 280 from the signals 268. In some embodiments, data 280 is temporarily stored in memory buffer 278-1. Then, the data 280 is stored in one or more storage cells 282.

In response to a read command, data 284 is read back from one or more of the storage cells 282. Prior to being transmitted to the other device, this data may be temporarily stored in memory buffer 278-2. Then, the data 284 may be forwarded to transmit circuits (Tx) 286, and may be transmitted as (analog or digital) signals 290.

Note that the timing of the forwarding, receiving, and/or transmitting may be gated by one or more timing signals provided by frequency synthesizer 274. Consequently, signals 290 may be transmitted and/or signals 268 may be received based on either or both edges in the one or more timing signals. In some embodiments, transmitting and receiving may be synchronous and/or asynchronous.

These timing signals may be generated based on one or more clock signals 272, which may be generated on-chip (for example, using a phase-locked loop and one or more reference signals provided by a frequency reference) and/or off-chip. Alternatively, timing signals or clock signals 272 may be recovered from signals 268, for example, using CDR circuit 264. Moreover, voltage levels and/or a voltage swing of the signals 290 may be based on voltages 288 provided by a power supply (not shown), and logic levels of the data 280 may be based on voltages 276 provided by the power supply. These voltages may be fixed or adjustable.

In some embodiments a period of the one or more timing signals, a skew or delay of the one or more timing signals, and/or one or more of the voltages 276 and 288 are adjusted based on a performance metric associated with communication to and/or from the memory device 260. This performance metric may include: a signal strength (such as a signal amplitude or a signal intensity), a mean square error (MSE) relative to a target (such as a detection threshold, a point in a constellation diagram, and/or a sequence of points in a constellation diagram), a signal-to-noise ratio (SNR), a bit-error rate (BER), a timing margin, and/or a voltage margin.

While not shown in FIG. 2B, in some embodiments the memory device 260 includes one or more additional receiver circuits coupled to the separate command link (or communication channel), which receive commands from the other device. However, in some embodiments commands are received using one or more of the receiver circuits 270.

Memory device 260 may include CDR circuit 264 and offset-calibration circuit 258 to determine and compensate for offset voltages of one or more samplers in receivers 270 (as described further below with reference to FIGS. 3-5). As noted previously, the offset voltage may be determined and corrected in a calibration operation mode (such as a startup calibration mode) or a normal operation mode (such as a real-time calibration mode). For example, during a calibration operation mode, a transmitter in another device (such as memory controller 210 in FIG. 2A) may transmit a training pattern. Alternatively, during a normal operation mode, one or more particular data patterns in signals 268 may be used when determining and calibrating the offset voltages. In some embodiments, control logic 262 is used to: select the operation mode; select the sampler(s) to be calibrated; and/or identify a data pattern in one or more signals 268 that is used when calibrating the offset voltage(s). Note that samples measured by one or more samplers may be stored in optional memory 266.

In some embodiments, control logic 262 includes the functionality of a memory controller. Thus, in some embodiments the memory device 260 includes a memory module and a memory controller. These components may be included in a chip package on one or more integrated circuits. For example, the chip package may include a first integrated circuit that includes the memory controller and a second integrated circuit that includes the memory module. As noted previously, the memory controller may be a local memory controller and/or a system memory controller.

In some embodiments of the memory controller 210 (FIG. 2A) and/or the memory device 260, additional techniques are used to recover or prevent the loss of data communicated between devices and/or the loss of stored data in storage cells 282. For example, at least a portion of the data communicated between devices and/or the stored data may include error-detection-code (EDC) information and/or error-correction-code (ECC) information. This EDC and/or ECC information may be pre-existing or may be dynamically generated (e.g., in real time).

In some embodiments, the ECC information includes a Bose-Chaudhuri-Hocquenghem (BCH) code. Note that BCH codes are a sub-class of cyclic codes. In exemplary embodiments, the ECC information includes: a cyclic redundancy code (CRC), a parity code, a Hamming code, a Reed-Solomon code, and/or another error checking and correction code.

Consequently, in some embodiments the receiver circuits 270 implement error detection and/or correction. For example, errors associated with communication may be detected by performing a multi-bit XOR operation in conjunction with one or more parity bits in the signals 268.

Moreover, control logic 212 (FIG. 2A) and/or 262 may take a variety of remedial actions in the event of an error or a degradation of one or more of the performance metrics during communication between the memory controller 210 (FIG. 2A) and the memory device 260. These remedial actions may include: re-transmitting previous data; transmitting previous or new data (henceforth referred to as data) using an increased transmission power than the transmission power used in a previous transmission; reducing the data rate in one or more of the sub-channels relative to the data rate used in a previous transmission; transmitting data with reduced intersymbol interference (for example, with blank intervals inserted before and/or after the data); transmitting data at a single clock edge (as opposed to dual-data-rate transmission); transmitting data with at least a portion of the data including ECC or EDC; transmitting data using a different encoding or modulation code than the encoding used in a previous transmission; transmitting data after a pre-determined idle time; transmitting data to a different receiver circuit; and/or changing the number of sub-channels. Note that in some embodiments one or more of these adjustments are performed: continuously; as needed (for example, based on one or more of the performance metrics); and/or after a pre-determined time interval.

In some embodiments, the remedial action (and more generally adjustments to one or more of the sub-channels) is based on control information that is exchanged between the memory controller 210 (FIG. 2A) and the memory device 260. This control information may be exchanged using in-band communication (e.g., via the frequency bands used to communicate the signals 230 (FIG. 2A), 232 (FIG. 2A), 268, and 290 and/or out-of-band communication (for example, using the separate link).

In some embodiments, the remedial action and/or adjustments involve an auto-negotiation technique. During this auto-negotiation technique, a receiver circuit in one of the devices may provide feedback to a transmit circuit in another device on the efficacy of any changes to the signals on a sub-channel. Based on this feedback, the transmit circuit may further modify these signals, e.g., may perform the remedial action.

Note that memory controller 210 (FIG. 2A) and/or memory device 260 may include fewer components or additional components. For example, signal lines coupling components may indicate multiple signal lines (or a bus). In some embodiments, memory controller 210 (FIG. 2A) and/or memory device 260 include pre-emphasis to compensate for losses and/or dispersion associated with inter-device communication. Similarly, in some embodiments a receiver of the signals includes equalization. Note that pre-emphasis and/or equalization may be implemented using feed-forward filters and/or decision-feedback-equalization circuits.

Components and/or functionality illustrated in memory controller 210 (FIG. 2A) and/or memory device 260 may be implemented using analog circuits and/or digital circuits. Moreover, components and/or functionality in either of these communication circuits may be implemented using hardware and/or software (such as firmware). For example, control logic 212 (FIG. 2A) and/or 262 may include a processor or a processor core, and CDR circuits 214 (FIG. 2A) and 264 and/or offset-calibration circuits 208 (FIG. 2A) and 258 may be implemented as instructions that are executed by control logic, the processor or the processor core.

In some embodiments, functionality of the control logic 212 (FIG. 2A) and 262 is provided by a processor in a computer system.

Note that two or more components in memory controller 210 (FIG. 2A) and/or memory device 260 may be combined into a single component and/or the position of one or more components may be changed. In some embodiments, memory controller 210 (FIG. 2A) and/or memory device 260 are included in one or more integrated circuits on one or more semiconductor die.

Figure 3A:
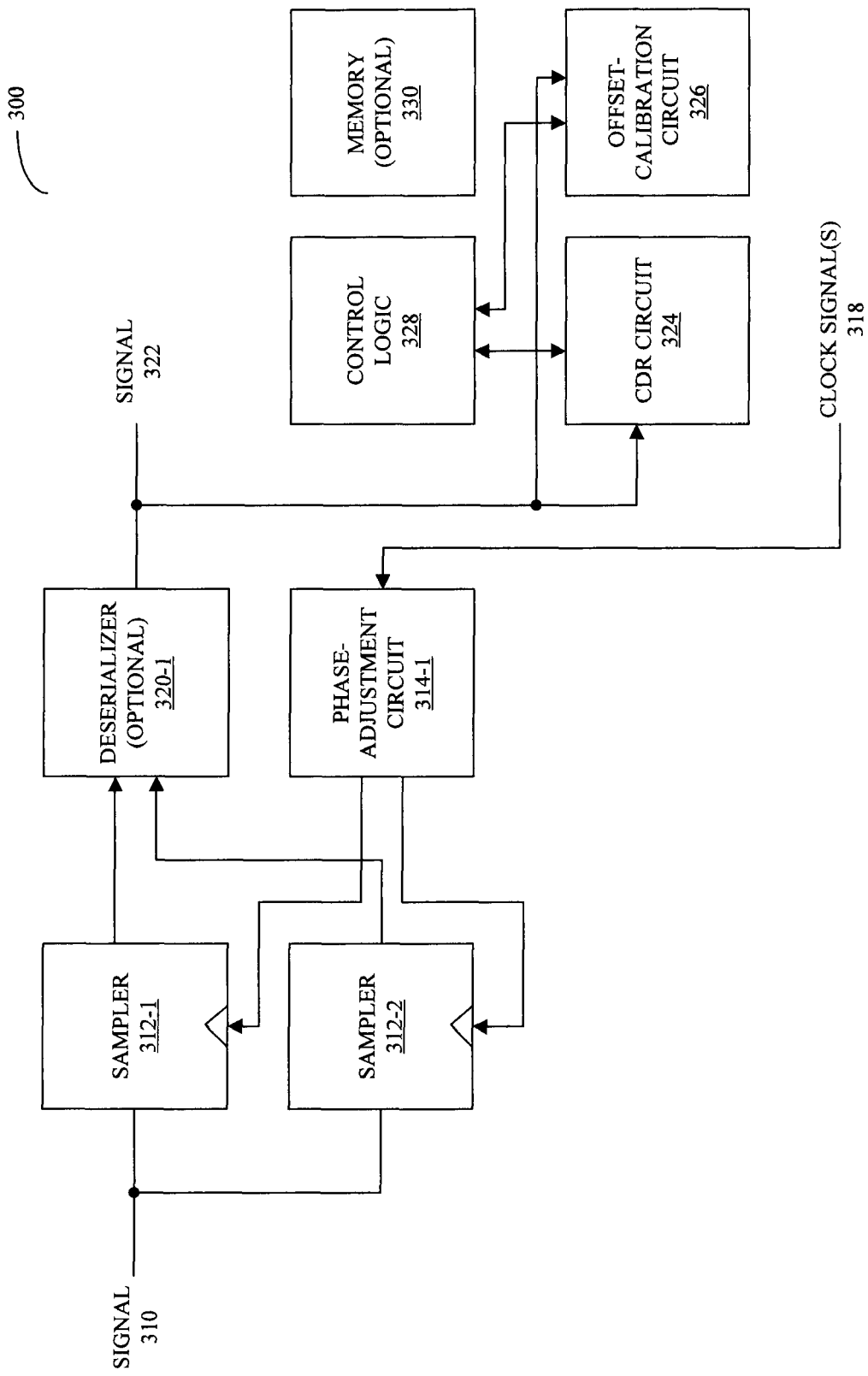
FIG. 3A is a block diagram illustrating an embodiment of a receiver circuit.

In the offset-voltage calibration technique, a pair of samplers may sample signals that are received by a receiver (such as one of the receivers 270 or 234 in FIG. 2A) proximate to a signal crossing point (also referred to as a transition edge) at an edge of an eye pattern associated with the signals. This is shown in FIG. 3A, which presents a block diagram illustrating an embodiment of a receiver circuit 300.

In particular, sample times of samplers 312 may be provided by phase-adjustment circuit 314-1 based on one or more clock signal(s) 318 (for example, using a phase-locked loop or a delay-locked loop) and instructions from control logic 328. These instructions may be based on information from CDR circuit 324, which may analyze signal 322 and may attempt to lock the sample times of one of the samplers 312, such as sampler 312-1, to the signal crossing point (the offset voltage of sampler 312-2 may be subsequently calibrated after calibration of sampler 312-1 is completed). Note that if there is no offset voltage, phase-adjustment circuit 314-1 will align the sample time of sampler 312-1 with the signal crossing point (as described further below with reference to FIG. 5A).

However, the offset voltage in the given sampler (such as sampler 312-1) creates a region of timing uncertainty, which is henceforth referred to as an undifferentiated timing region. In this region, CDR circuit 324 obtains an equal number of early and late samples of signal 322. Consequently, the information provided by CDR circuit 324 may result in dithering about the present sample time of sampler 312-1 based on the present offset voltage.

As described below with reference to FIGS. 5B-5D, samples taken within the undifferentiated timing region indicate the sign of the offset voltage of sampler 312-1. Therefore, in this region, offset-calibration circuit 326 may determine and adjust the present offset voltage of the sampler 312-1. By operating CDR circuit 324 and offset-calibration circuit 326 in parallel, the CDR circuit 324 and the offset-calibration circuit 326 may iteratively converge on the signal crossing point and, thus, a residual offset voltage of the sampler 312-1.

Figure 4A:
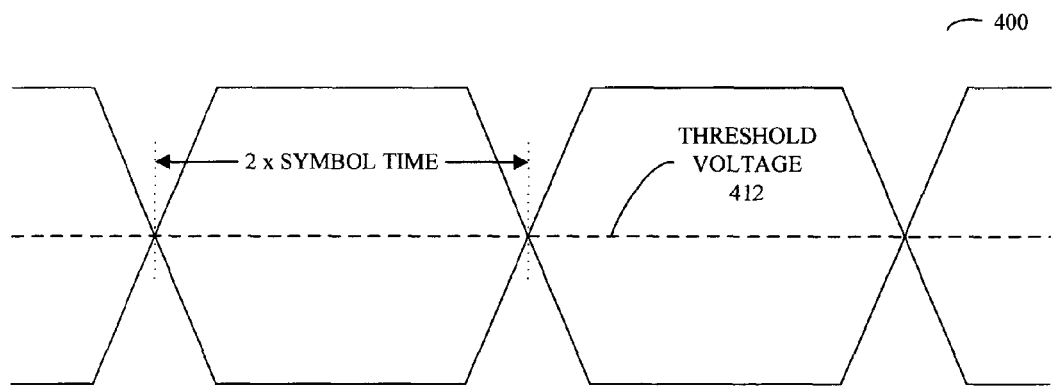
FIG. 4A is a timing diagram illustrating an embodiment of signals.
Figure 4B:
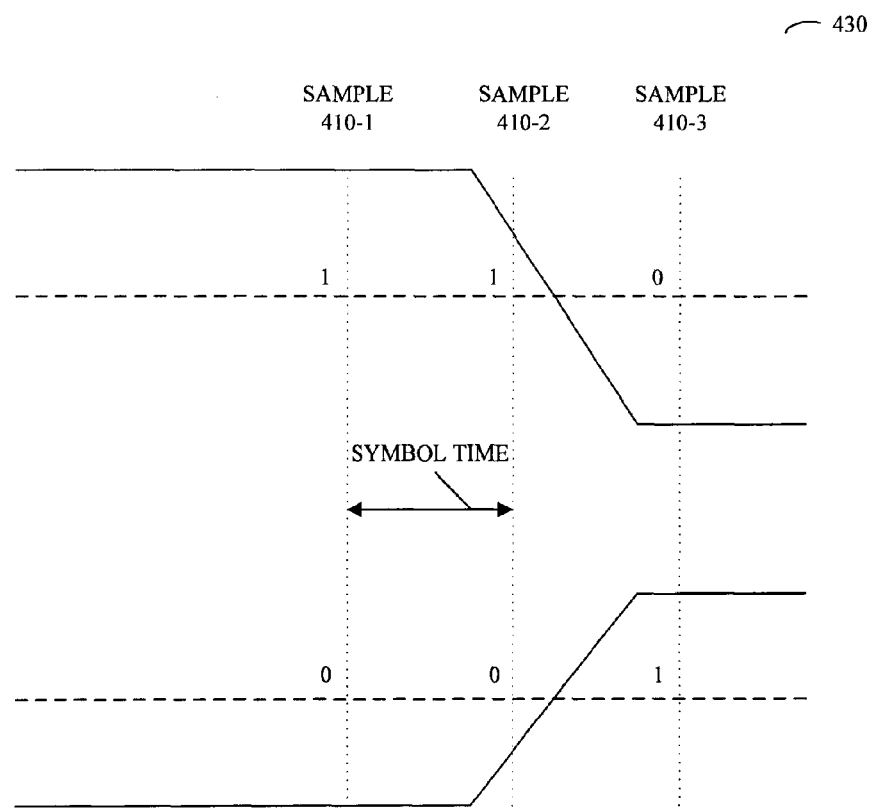
FIG. 4B is a timing diagram illustrating an embodiment of signals.
Figure 4C:
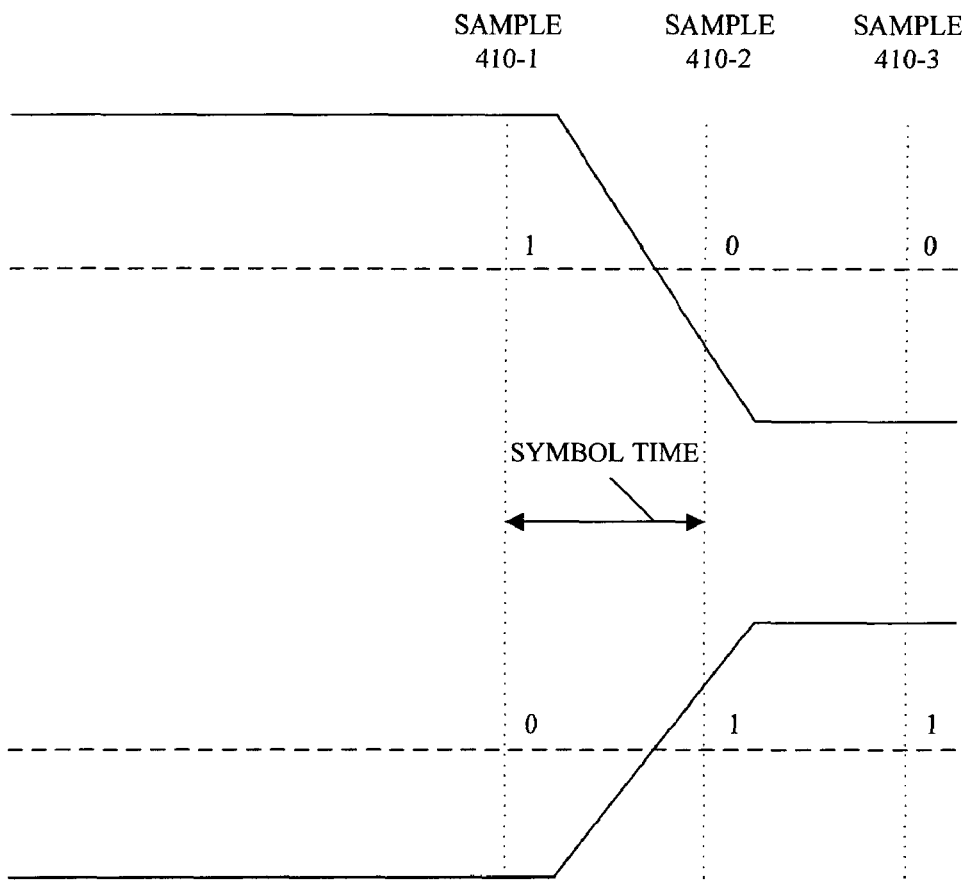
FIG. 4C is a timing diagram illustrating an embodiment of signals.

Additionally, as described further below with reference to FIGS. 4B-4C, in some embodiments sampler 312-1 samples signals 310 at a first time and a sampler 312-2 samples signals 310 at a second time, where a difference between the second time and the first time substantially equals a bit time (or more generally, a symbol time) of the signals 310. Moreover, when sampler 312-2 is being calibrated, sampler 312-1 may also sample signals 310 at a third time, where a difference between the third time and the second time substantially equals the symbol time of the signals 310. (Alternatively, when sampler 312-1 is being calibrated, sampler 312-2 may sample signals 310 at the first time and then at the third time.) For example, based on instructions from control logic 328, phase-adjustment circuit 314-1 may adjust the sample times of the samplers 312 to allow samples to be taken at the first time, the second time and the third time.

Note that the sample time of the given sampler (such as sampler 312-1) may be adjusted (based on information from CDR circuit 324) based on the samples taken at the first time, the second time, and the third time. For example, the first time may precede a time corresponding to the edge or signal crossing point of the eye pattern, and the third time may be after the time corresponding to the signal crossing point of the eye pattern.

Additionally, note that one or more of these samples may be temporarily stored in optional memory 330 for subsequent use in locking the sample time of the given sampler (such as sampler 312-1) to the signal crossing point and in calibrating the offset voltage.

In some embodiments, receiver circuit 300 includes an optional deserializer 320-1, such as a first-in first-out buffer, that converts serial data to a parallel word. For example, optional deserializer 320-1 may convert data on a single link into data on 16 parallel links.

Receiver circuit 300 may be used to determine and adjust the offset voltages of the samplers 312 in a calibration operation mode (such as a startup calibration mode). During this operation mode, a training pattern may be provided to such receiver circuits by a transmitter in another circuit. This training pattern may include a squarewave data pattern, such as a squarewave pattern having a fundamental period that is four times the bit or symbol time (as described below with reference to FIG. 4A).

As noted previously, based on instructions from control logic 328, the offset voltage of one of the samplers 312 at a time may be calibrated. For example, for a '11001100' training pattern in which the eye pattern has a width of two symbol times, one of the samplers 312 can be configured to sample proximate to the signal crossing point, while the other of the samplers 312 will be sampling proximate to the center of the eye pattern.

Next, the offset voltage of another of the samplers 312 may be calibrated, and the process may be continued until the offset voltages of all of the samplers 312 are calibrated. Then, the receiver circuit 300 may switch to a normal operation mode, in which CDR circuit 324 may provide information to lock the sample times of samplers 312 proximate to the center of the eye pattern.

Figure 3B:
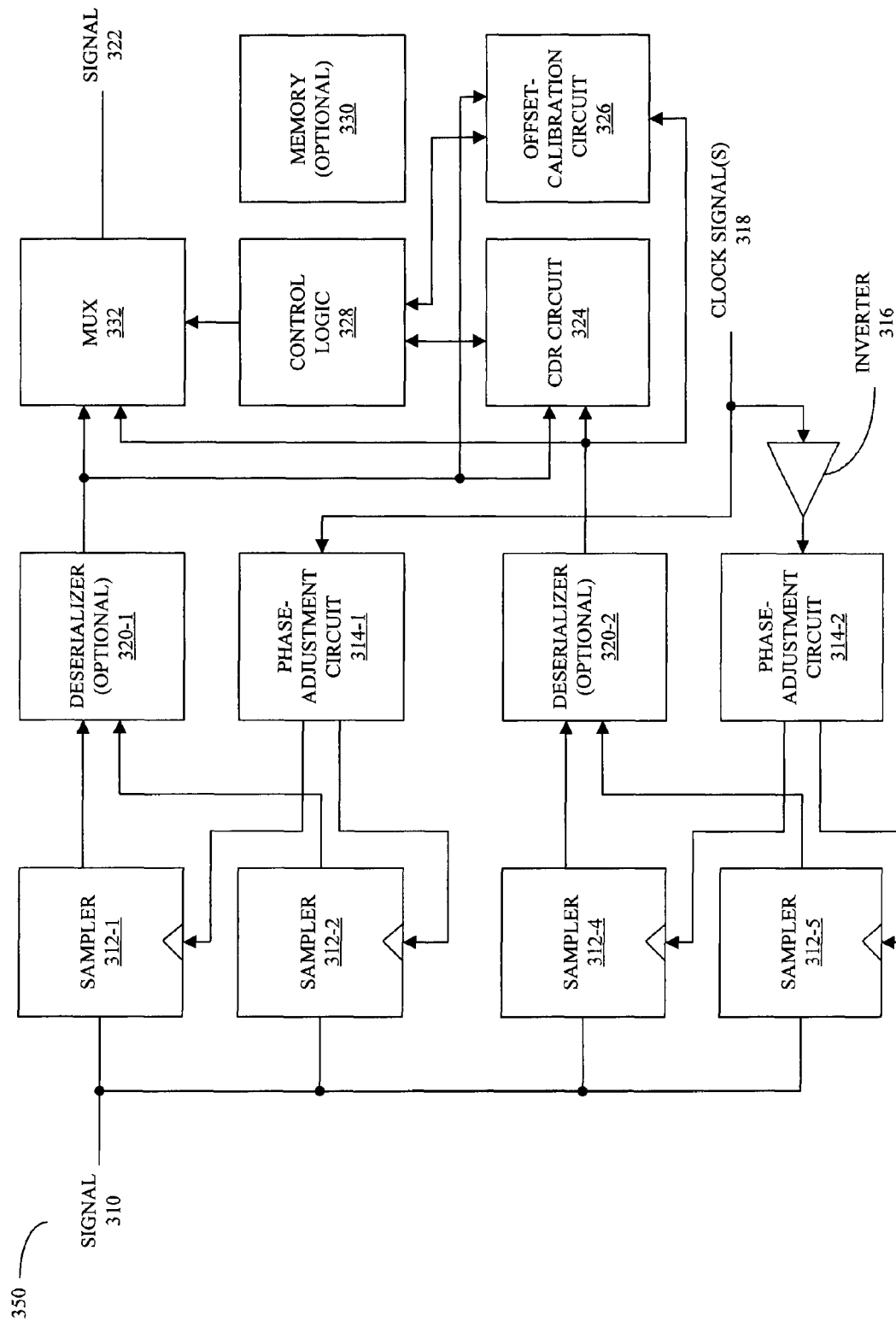
FIG. 3B is a block diagram illustrating an embodiment of a receiver circuit.

Note that these receiver circuits may be used to determine and adjust offset voltages associated with transistor mismatch (for example, offset voltages associated with process variations). However, in some embodiments real or live data during the normal operation mode (or real-time calibration mode) is used to determine and adjust offset voltages associated with: transistor mismatch, temperature variations, and/or power-supply variations. (Although, at start-up, the offset voltages may be calibrated during a calibration operation mode, such as a startup calibration mode.) This is shown in FIG. 3B, which presents a block diagram illustrating an embodiment of a receiver circuit 350.

In this embodiment, two additional samplers 312-4 and 312-5 are used to sample signals 310 proximate to a center of the eye pattern associated with the signals 310. Note that sampler 312-4 and 312-5 may be substantially spaced by the bit or symbol time. Moreover, samplers 312-4 and 312-5 may have sample times that are independent of the other samplers (such as samplers 312-1 and 312-2 in FIG. 3A). For example, sample times of samplers 312-4 and 312-5 may be determined by phase-adjustment circuit 314-2 based on one or more clock signal(s) 318 and instructions from control logic 328. Note that the one or more clock signal(s) 318 may be inverted by inverter 316 prior to coupling these signals to phase-adjustment circuit 314-2, thereby setting the sample times of samplers 312-4 and 312-5 proximate to the center of the eye pattern.

Based on these samples, control logic 328 may identify a data pattern in the signals. Moreover, samples associated with the data pattern may be used to determine and adjust the offset voltage of a given sampler. Note that this data pattern may include two consecutive instances of a first value followed by two consecutive instances of a second value, such as a '1100' data pattern.

In some embodiments, after the offset voltages of samplers 312-1 and 312-2 have been calibrated, control logic 328 selectively switches the roles of samplers 312-1 and 312-2 and samplers 312-4 and 312-5, thereby allowing offset voltages of these additional samplers to be determined and adjusted. For example, after the offset voltages of samplers 312-1 and 312-2 have been calibrated, the sampling times of these samplers may be adjusted so that they are also sampling proximate to the center of the eye pattern. Then, the sampling times of samplers 312-3 and 312-4 may be adjusted to be proximate to the signal crossing point and the calibration technique may be used to calibrate the offset voltages of these samplers. This cycle may be repeated periodically or as needed to update the offset voltages for the samplers 312.

Note that the samplers 312 may be switched seamlessly to preserve system performance (e.g., a good data stream).

Moreover, in some embodiments after the offset voltages of one or more samplers 312 have been determined and adjusted in either the calibration operation mode or the normal operation mode, receiver circuits 300 (FIG. 3A) and 350 may then adjust the timing margin.

In some embodiments, receiver circuits 300 (FIG. 3A) and 350 include fewer or additional components. For example, instances of these receiver circuits may be used to calibrate offset voltages of each bit or link in a parallel interface. Note that these receiver circuits and the offset-voltage calibration technique may be used with differential signals and/or single-ended signals. In some embodiments, the offset-voltage calibration technique is used to set a reference voltage of a given sampler in a single-ended receiver circuit. Moreover, two or more components can be combined into a single component, and/or a position of one or more components may be changed.

In an exemplary embodiment, the offset-voltage calibration technique is used with devices and systems that have low common mode and low signal swing. For example, signal 310 (FIGS. 3A and 3B) may have a differential amplitude of 50-300 mVpp. Note that, in some embodiments (either single-ended or differential) a lower voltage swing is used, while in other embodiments a higher voltage swing is used, such as LVDS (350 mV differential swing), LVTTL (upwards of 3.3 V swing), and/or TTL (upwards of 5.0 V swing).

As noted previously, signal 310 may include a training pattern that includes quadrature signals. This is shown in FIG. 4A, which presents a timing diagram 400 illustrating an embodiment of signals. In some embodiments, these signals have a period of 4 times the symbol time.

This training pattern has a number of features that are useful when determining the offset voltage, including: DC balance; insensitivity to duty-cycle distortion (because there is only a signal transition every two symbol times); no intersymbol interference (because there is only a single frequency component); no data-dependent jitter (because there is only a single frequency component); and equal weighting of rising and falling signal transitions (because samples alternate between '0' and '1'). Note that because there is no intersymbol interference, the signal crossing points in the eye pattern are approximately fixed and are located directly between the maximum and minimum voltages. These signal crossing points define an ideal voltage level or threshold voltage 412 for deciding if a particular sample corresponds to a first value or a second value, such as a '0' or a '1'. As noted previously, an iterative technique may be used in proximity to one of these signal crossing points to determine and adjust the offset voltage of the given sampler.

During the offset-voltage calibration, the sample time of the given sampler is locked to the nearest signal crossing point or edge of the eye pattern by CDR circuit 324 (FIGS. 3A and 3B). As shown in FIG. 4B, which presents a timing diagram 430 illustrating an embodiment of signals, this may be implemented by comparing samples of the given sampler (such as sample 410-2) with samples taken one symbol time earlier (sample 410-1) and samples taken one symbol time later (sample 410-3). Note that these other samples may be obtained by a complementary sampler partner in a pair of samplers (such as samplers 312-1 and 312-2 in FIGS. 3A and 3B).

Moreover, the comparisons of the samples 410 may be used to adjust one or more phase-adjustment circuits 314 (FIGS. 3A and 3B). For example, if sample 410-2 is the same as sample 410-1, then the sample time of sample 410-2 is early with respect to the signal crossing point. In this case, a phase-adjustment circuit, such as phase-adjustment circuit 314-1 (FIGS. 3A and 3B), would be updated to delay this sample time. However, as shown in FIG. 4C, which presents a timing diagram 460 illustrating an embodiment of signals, if sample 410-2 is the same as sample 410-3, then the sample time of sample 410-2 is late with respect to the signal crossing point. In this case, phase-adjustment circuit 314-1 (FIGS. 3A and 3B) would be updated to advance this sample time. More generally, CDR circuit 324 (FIGS. 3A and 3B) may use a large sample size of early/late statistics to decide when to delay or advance the phase of the sample time of the given sampler, with the goal of aligning it to the center of the signal crossing point.

Figure 5A:
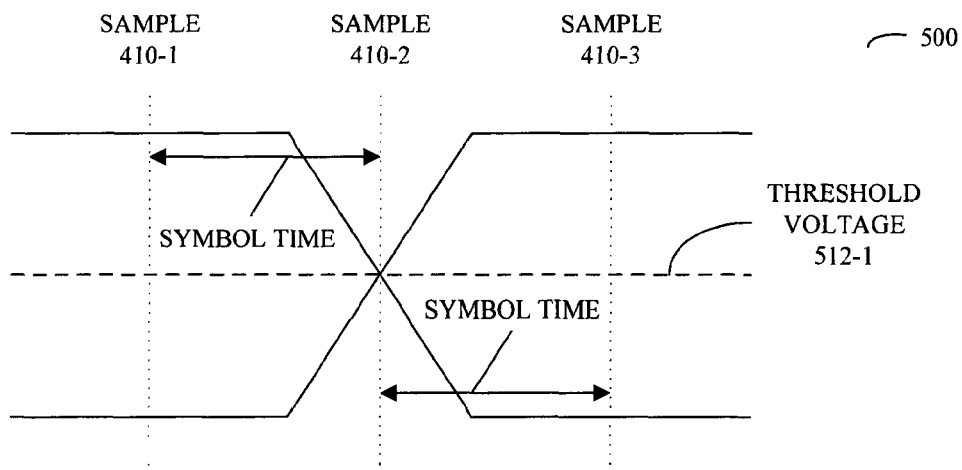
FIG. 5A is a timing diagram illustrating an embodiment of signals.

As noted previously, if the offset voltage is zero phase-adjustment circuit 314-1 (FIGS. 3A and 3B) will align the sample time of the given sampler with the signal crossing point (within the resolution of this phase-adjustment circuit). This is shown in FIG. 5A, which presents a timing diagram 500 illustrating an embodiment of signals. Note that threshold voltage 512-1 passes through the signal crossing point (e.g., the offset voltage is zero).

Figure 5B:
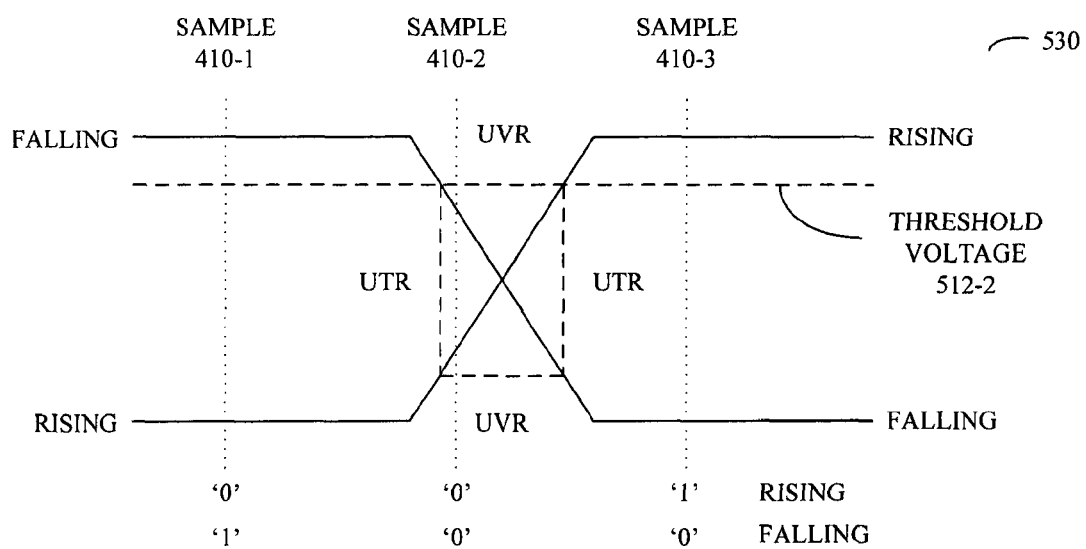
FIG. 5B is a timing diagram illustrating an embodiment of signals.

However, as shown in FIG. 5B, which presents a timing diagram 530 illustrating an embodiment of signals, a finite offset voltage in threshold voltage 512-2 of the given sampler creates a region of timing uncertainty (the undifferentiated timing region) for the CDR circuit 324 (FIGS. 3A and 3B). As shown by the dashed box, this undifferentiated timing region is bounded in time by the intersection points of the threshold voltage 512-2 and the signal transitions. In this undifferentiated timing region, the given sampler sees an equal number of rising and falling edges. Consequently, the CDR circuit 324 (FIGS. 3A and 3B) will determine an equal number of 'early's and 'late's, and will not be driven in either direction. From the standpoint of the CDR circuit 324 (FIGS. 3A and 3B), all phase settings of the phase-adjustment circuit 314-1 (FIGS. 3A and 3B) within the undifferentiated timing region are equivalent.

It is within this undifferentiated timing region that the offset voltage in the threshold voltage of the given sample can be determined and adjusted. For example, as shown in timing diagram 530, if threshold voltage 512-2 is too high, all samples (on both rising and falling signal transitions) from the given sampler (such as sample 410-2) will be '0's. In particular, for a rising transition samples 410 may be '001' and for a falling transition samples 410 may be '100.'

Figure 5C:
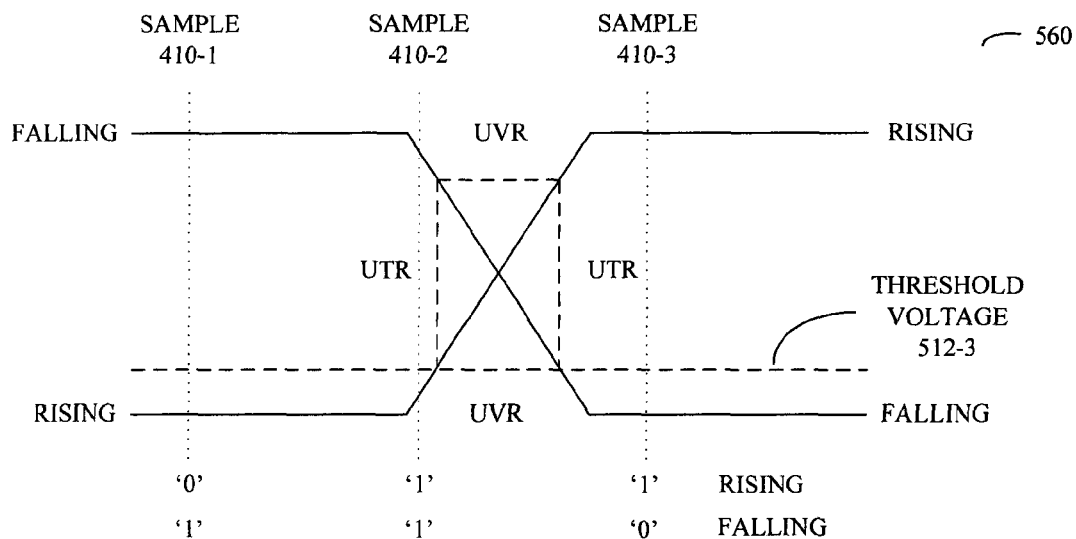
FIG. 5C is a timing diagram illustrating an embodiment of signals.

However, as shown in FIG. 5C, which presents a timing diagram 560 illustrating an embodiment of signals, if threshold voltage 512-3 is too low, all samples (on both rising and falling signal transitions) from the given sampler (such as sample 410-2) will be '1's. In particular, for a rising transition samples 410 may be '011' and for a falling transition samples 410 may be '110.'

Note that when operating in the undifferentiated timing region, a majority vote of collected samples from the given sampler can be used to adjust the offset voltage. In particular, based on the samples 410, the sign of the offset voltage may be determined and a digital-to-analog converter in offset-calibration circuit 326 (FIGS. 3A and 3B) may be adjusted.

Figure 5D:
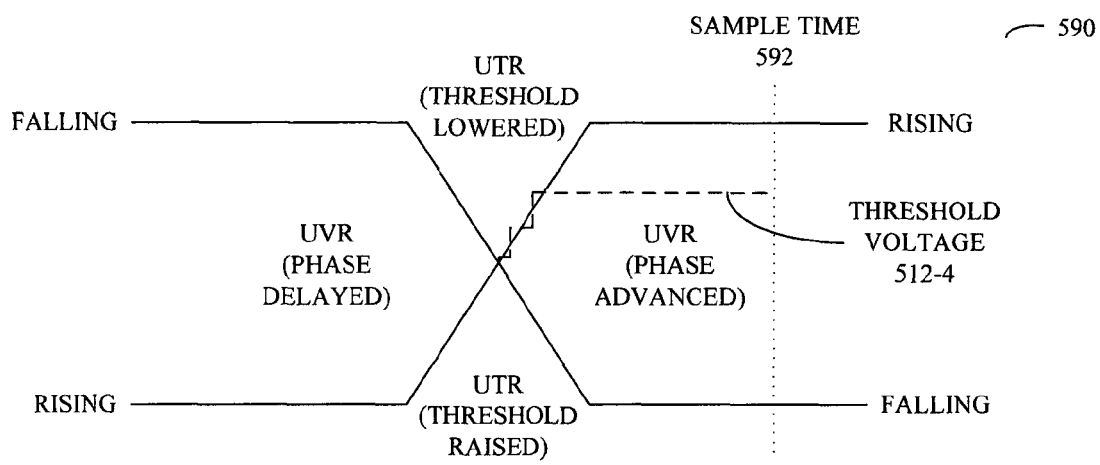
FIG. 5D is a timing diagram illustrating an embodiment of signals.

As shown in FIG. 5D, which presents a timing diagram 590 illustrating an embodiment of signals, the signal crossing point divides voltage/time space into four quadrants: two represent undifferentiated timing regions (UTR), and two represent undifferentiated voltage regions (UVR). Note that the undifferentiated voltage regions indicate that the sampler threshold voltage is between the two overlapping waveforms. Because the sampler samples alternating 0's and 1's, no decisions can be made as to how to adjust the offset voltage.

In some embodiments, when the CDR circuit 324 (FIGS. 3A and 3B) and the offset-calibration circuit 326 (FIGS. 3A and 3B) run in parallel, only one of them may be updated at a given time, depending on the current region of operation. However, this may not be an explicit decision performed by control logic 328 (FIGS. 3A and 3B). Instead, it may be likely that only one of these circuits updates at a given time.

Moreover, each time a signal transition is crossed, the adjustments made by the CDR circuit 324 (FIGS. 3A and 3B) and the offset-calibration circuit 326 (FIGS. 3A and 3B) may switch. For example, when threshold voltage 512-4 is adjusted, the operating point (sample time and threshold voltage) of the given sampler may leave one of the undifferentiated timing regions and may enter one of the undifferentiated voltage regions. When this happens, the CDR circuit 324 (FIGS. 3A and 3B) may go back into full swing, rotating the phase of the sample time closer to the signal crossing point. Therefore, the operating point of the given sampler may roughly trace the nearest signal transition toward the signal crossing point, alternating between undifferentiated timing regions and undifferentiated voltage regions. This is shown in timing diagram 590, where initial threshold voltage 512-4 and sample time 592 are iteratively adjusted until the signal crossing point and the residual offset voltage (based on the resolution of the offset-calibration circuit 326 in FIGS. 3A and 3B) are obtained.

Note that timing and voltage jitter can play an important role in the offset-voltage calibration technique. For example, jitter may provide a region of 'fuzz' around the signal crossing point, allowing the offset-voltage calibration technique to collect useful statistics from different undifferentiated regions. Consequently, this 'fuzz' may facilitate convergence of the operating point of the given sampler to the signal crossing point, within the resolution of the CDR circuit 324 (FIGS. 3A and 3B) and the offset-calibration circuit 326 (FIGS. 3A and 3B).

We now describe embodiments of processes for calibrating a receiver circuit. FIG. 6 presents a flow chart illustrating an embodiment of a process 600 for calibrating a receiver circuit, which may be performed by a circuit or device. During operation, the device adjusts a sample time of a receiver circuit using a clock-data-recovery technique so that a sample time of the receiver circuit is proximate to a signal crossing point at an edge of an eye pattern associated with signals received by the receiver circuit (610), where the receiver circuit includes a first sampler and a second sampler. Next, the device determines a present offset voltage of a given sampler, which can be the first sampler or the second sampler, in a timing region proximate to the signal crossing point in which the clock-data-recovery technique dithers about a present sample time based on the present offset voltage (612). Then, the device iteratively converges on the signal crossing point and a residual offset voltage of the given sampler (614).

In some embodiments of the process 600 there may be fewer or additional operations. Moreover, two or more operations can be combined into a single operation, and/or a position of one or more operations may be changed.

Devices and circuits described herein may be implemented using computer aided design tools available in the art, and embodied by computer-readable files containing software descriptions of such circuits. These software descriptions may be: at behavioral, register transfer, logic component, transistor and layout geometry level descriptions. Moreover, the software descriptions may be stored on storage media or communicated by carrier waves.

Data formats in which such descriptions may be implemented include, but are not limited to: formats supporting behavioral languages like C, formats supporting register transfer level RTL languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
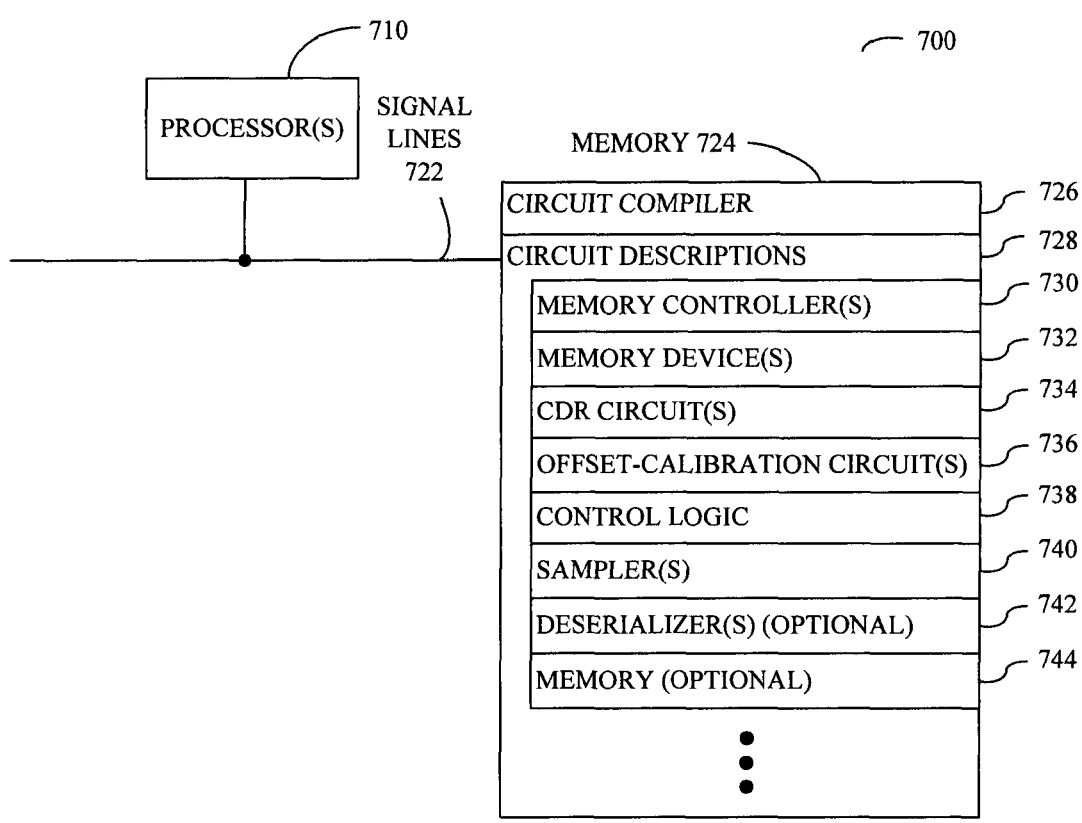
FIG. 7 is a block diagram illustrating an embodiment of a system.

FIG. 7 presents a block diagram illustrating an embodiment of a system 700 that stores such computer-readable files. This system may include at least one data processor or central processing unit (CPU) 710, memory 724 and one or more signal lines or communication busses 722 for coupling these components to one another. Memory 724 may include high-speed random access memory and/or non-volatile memory, such as: ROM, RAM, EPROM, EEPROM, Flash, one or more smart cards, one or more magnetic disc storage devices, and/or one or more optical storage devices.

Memory 724 may store a circuit compiler 726 and circuit descriptions 728. Circuit descriptions 728 may include descriptions for the circuits, or a subset of the circuits discussed above with respect to FIGS. 1-6. In particular, circuit descriptions 728 may include circuit descriptions of: one or more memory controllers 730, one or more memory devices 732, one or more CDR circuits 734, one or more offset-calibration circuits 736, control logic 738 (or a set of instructions), one or more samplers 740, one or more optional deserializers 742, and/or optional memory 744.

In some embodiments, system 700 includes fewer or additional components. Moreover, two or more components can be combined into a single component, and/or a position of one or more components may be changed.

In some embodiments, a circuit includes a receiver circuit that receives signals, including a first sampler and a second sampler. A clock-data-recovery circuit in the receiver circuit may adjust a sample time of the receiver circuit so that the sample time is proximate to a signal crossing point at an edge of an eye pattern associated with the signals. Moreover, an offset-calibration circuit in the receiver circuit may determine and adjust an offset voltage of a given sampler, which can be the first sampler or the second sampler. Note that the offset-calibration circuit may determine a present offset voltage of the given sampler in a timing region proximate to the signal crossing point in which the clock-data-recovery circuit dithers about a present sample time based on the present offset voltage. Additionally, note that the clock-data-recovery circuit and the offset-calibration circuit may iteratively converge on the signal crossing point and a residual offset voltage of the given sampler.

In some embodiments, the first sampler samples the signals at a first time and a second sampler samples the signals at a second time, where a difference between the second time and the first time substantially equals a symbol time of the signals. Moreover, when the given sampler is the second sampler, the first sampler may also sample the signals at a third time, where a difference between the third time and the second time substantially equals the symbol time of the signals. Note that samples at the first time and/or the third time may be stored in memory.

In some embodiments, the sample time is adjusted based on samples taken at the first time, the second time, and the third time.

Note that the first time may precede a time corresponding to the edge of the eye pattern and the third time may be after the time corresponding to the edge of the eye pattern.

In some embodiments, the receiver circuit includes two additional samplers having sample times which are independent of those of the first sampler and the second sampler, and which are substantially spaced by the symbol time. Note that the two additional samplers may sample the signals proximate to a center of the eye pattern associated with the signals.

Moreover, the receiver circuit may include control logic that identifies a data pattern in the signals based on samples from the two additional samplers, and that enables the determining and adjusting of the offset voltage for samples associated with the data pattern. This data pattern may include two consecutive instances of a first value followed by two consecutive instances of a second value.

In some embodiments, the control logic selectively switches the roles of the first and second samplers and the additional samplers, thereby allowing offset voltages of the additional samplers to be determined and adjusted.

Additionally, the two additional samplers and the control logic may facilitate the determining and adjusting of the offset voltage using signals corresponding to data in a normal operation mode.

However, in some embodiments the offset voltage is determined during a calibration operation mode. Moreover, after determining the offset voltage and returning to a normal operation mode, the clock-data-recovery circuit may adjust the sample time of the receiver circuit so that the sample time is proximate to a center of the eye pattern associated with the signals. Note that the signals may include a training pattern, such as a squarewave pattern having a fundamental period that is four times a symbol time.

In some embodiments, the signals are quadrature signals. Moreover, the signals may include differential signals and/or single-ended signals.

Another embodiment provides an integrated circuit disposed on a semiconductor die that includes the circuit.

Another embodiment provides a system that includes the circuit. For example, the system may include the memory controller (which may include an instance of the circuit) and a memory device (which may include an instance of the circuit) coupled to the memory controller. Moreover, in some embodiments the system is implemented on a chip package that includes an integrated circuit with the memory controller and the memory device or separate integrated circuits with, respectively, the memory controller and the memory device.

Another embodiment provides a computer-readable medium that includes data that specifies the circuit.

Another embodiment provides a method for calibrating a receiver circuit, which may be performed by a device or the circuit. During operation, the device adjusts a sample time of a receiver circuit using a clock-data-recovery technique so that a sample time of the receiver circuit is proximate to a signal crossing point at an edge of an eye pattern associated with signals received by the receiver circuit, where the receiver circuit includes a first sampler and a second sampler. Next, the device determines a present offset voltage of a given sampler, which can be the first sampler or the second sampler, in a timing region proximate to the signal crossing point in which the clock-data-recovery technique dithers about a present sample time based on the present offset voltage. Then, the device iteratively converges on the signal crossing point and a residual offset voltage of the given sampler.

Another embodiment provides a computer program product for use in conjunction with a computer system. This computer program product includes a computer-readable storage medium and a computer-program mechanism embedded therein for configuring the computer system. Moreover, this computer-program mechanism may include instructions corresponding to operations performed by the circuit, such as the operations performed in the method.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A receive circuit, comprising:
a receiver that samples a signal, the receiver comprising a first sampler that samples a voltage level associated with an expected edge of the signal and a second sampler that samples digital values represented by the signal, the samplers collectively generating a set of at least three samples associated with each one of plural edge crossings in the signal;
a phase alignment circuit that detects an edge of the signal; and
an offset-calibration circuit coupled to the phase alignment circuit to correct, responsive to correlation of specific signal patterns with edge timing represented by the signal, receiver voltage offset associated with sampling the signal in dependence upon detected correlation, wherein the offset-calibration circuit corrects the receiver voltage offset by varying the receiver voltage offset by a first polarity if a correlation is detected that indicates that an actual edge tends to be early with respect to an expected edge for a first signal transition and late with respect to an expected edge for a second signal transition, and by a second polarity if correlation is detected that indicates that the actual edge tends to be late with respect to the expected edge for the first signal transition and early with respect to the expected edge for the second signal transition.

2. The receive circuit of claim 1, where the offset-calibration circuit corrects for receiver voltage offset to urge the sampler toward a level where specific signal transitions are not correlated with an early or late edge timing, to thereby cause the phase alignment circuit to dither about an expected data transition edge notwithstanding inherent receiver voltage offset associated with sampling of the signal.

3. The receive circuit of claim 1, where:
the offset-calibration circuit corrects receiver voltage offset by increasing an effective receiver sampling threshold in response to (i) correlation of an early edge crossing with a low-to-high logic transition and (ii) correlation of a late edge crossing with a high-to-low logic transition; and
the offset-calibration circuit corrects receiver voltage offset by decreasing the effective receiver sampling threshold in response to (iii) correlation of a late edge crossing with a low-to-high logic transition and (iv) correlation of an early edge crossing with a high-to-low logic transition.

4. The receive circuit of claim 1, where the two samplers sample the signal using a phase separation of approximately ninety degrees.

5. The receive circuit of claim 1, further comprising:
means for switching roles of the two samplers; and
means for correcting offset for each of the two samplers during a calibration mode.

6. The receive circuit of claim 1, where the signal is a binary signal.

7. The receive circuit of claim 1, embodied as a memory device.

8. The receive circuit of claim 1, embodied as a memory controller.

9. The receive circuit of claim 1, further comprising a mode in which voltage offset is calibrated and corrected.

10. The receive circuit of claim 1, wherein the phase alignment circuit is part of a clock recovery circuit that recovers the receiver clock from the signal.

11. A receive circuit, comprising:
a first sampler to sample edge crossings of a signal;
a second sampler to sample data values of the signal;
a phase adjustment circuit to generate an adjusted phase based upon sampled edge crossings and to provide the adjusted phase to the second sampler to time the sampling of the data values; and
an offset-calibration circuit to provide a voltage offset correction to adjust the sampling of edge crossings by the second sampler;
where the offset-calibration circuit is adapted to respond to correlation between specific data value transition patterns and timing of edge crossings by adjusting the voltage offset correction in an iterative manner to reduce detected correlation, where the offset-calibration circuit corrects the voltage offset by varying the voltage offset by a first polarity if a correlation is detected that indicates that an actual edge tends to be early with respect to an expected edge for a first signal transition and late with respect to an expected edge for a second signal transition, and by a second polarity if correlation is detected that indicates that the actual edge tends to be late with respect to the expected edge for the first signal transition and early with respect to the expected edge for the second signal transition; and
where the phase adjustment circuit is adapted to converge on an edge crossing point of the signal based upon the voltage offset correction.

12. The receive circuit of claim 11, where the first sampler and the second sampler are controlled to perform sampling at relative times defined by a fixed receiver clock phase difference.

13. The receive circuit of claim 12, where the fixed receiver clock phase difference is ninety degrees.

14. A receive circuit, comprising:
a phase detector to adjust a clock phase dependent upon a signal edge crossing;
an offset-calibration circuit to correct voltage offset to adjust voltage level of the edge crossing relative to the signal in response to correlation between (i) early/late tendencies of the signal with respect to the expected edge crossing, and (ii) at least one specific signal transition pattern, the offset-calibration circuit;
a first sampler to sample the signal using the clock phase;
a second sampler used to sample edge crossings, where the offset-calibration circuit is coupled to the second sampler to correct voltage offset in the second sampler; and
circuitry for switching the role of each of the samplers, to alternatively correct voltage offset in each of the samplers.

15. The receive circuit of claim 14, where the phase detector is an Alexander phase detector.

16. The receive circuit of claim 14 embodied in a system, the system also comprising memory and control logic, the memory to store information representing edge samples, the control logic to detect the correlation from the information stored in the memory and to control the offset-cancelation circuit to correct voltage offset.

17. A method of determining an voltage offset in a receiver circuit, comprising:
detecting data level transitions in a digital signal;
detecting data edges in the digital signal;
detecting occurrence of at least one predetermined pattern based on the data level transitions; and
monitoring correlation between an early/late tendency of the data edge and at least one predetermined signal pattern, and responsively adjusting voltage offset associated with detecting the data edges, wherein adjusting the voltage offset comprises varying the voltage offset by a first polarity if a correlation is detected that indicates that an actual edge tends to be early with respect to an expected edge for a first signal transition and late with respect to an expected edge for a second signal transition, and by a second polarity if correlation is detected that indicates that the actual edge tends to be late with respect to the expected edge for the first signal transition and early with respect to the expected edge for the second signal transition.

18. The method of claim 17, where detecting data edges includes detecting data edges based on adjusted voltage offset, and where the method further comprises generating a receiver clock based upon adjusted voltage offset.

19. The method of claim 17, further comprising using multiple samplers, selectively reassigning sampler function for use in sampling data edges, and independently adjusting voltage offset of each samplers to independently for each sampler reduce correlation between an early/late tendency of the data edge with at least one predetermined signal pattern.

20. A method, comprising:
sampling edge crossings of a signal;
sampling data values of the signal;
adjusting phase based upon sampled edge crossings and using the adjusted phase to time the sampling of the data values; and
detecting correlation between specific data value transition patterns and timing of edge crossings;
adjusting voltage offset associated with sampling of the edge crossings in an iterative manner to reduce detected correlation, wherein adjusting the voltage offset comprises varying the voltage offset by a first polarity if a correlation is detected that indicates that an actual edge tends to be early with respect to an expected edge for a first signal transition and late with respect to an expected edge for a second signal transition, and by a second polarity if correlation is detected that indicates that the actual edge tends to be late with respect to the expected edge for the first signal transition and early with respect to the expected edge for the second signal transition; and
converging on an edge crossing point of the signal based upon the voltage offset correction.

21. An apparatus comprising instructions stored on machine-readable media, the instructions, when executed, adapted to cause a machine to:
detect data level transitions in a digital signal;
detect data edges in the digital signal;
detect occurrence of at least one predetermined pattern based on the data level transitions;
monitor correlation between an early/late tendency of the data edge with at least one predetermined signal pattern; and
responsive to correlation, adjust voltage offset associated with detecting the data edges, wherein adjusting the voltage offset comprises varying the voltage offset by a first polarity if a correlation is detected that indicates that an actual edge tends to be early with respect to an expected edge for a first signal transition and late with respect to an expected edge for a second signal transition, and by a second polarity if correlation is detected that indicates that the actual edge tends to be late with respect to the expected edge for the first signal transition and early with respect to the expected edge for the second signal transition.

22. A computer-readable medium containing data representing a receive circuit, where the receive circuit includes:
a phase detector to adjust a clock phase dependent upon a signal edge crossing;
an offset-calibration circuit to correct voltage offset in response to correlation between (i) early/late tendencies of the signal with respect to the expected edge crossing, and (ii) at least one specific signal transition pattern, the offset-calibration circuit correcting voltage offset to adjust voltage level of the edge crossing relative to the signal;
a first sampler to sample an input signal using the clock phase;
a second sampler used to sample edge crossings, where the offset-calibration circuit is coupled to the second sampler to correct voltage offset in the second sampler; and
circuitry for switching the role of each of the samplers, to alternatively correct voltage offset in each of the samplers.

23. The computer-readable medium of claim 22, where the receive circuit is embodied in a memory controller that includes memory and control logic, the memory to store information representing edge samples, the control logic to detect the correlation from the information stored in the memory and to control the offset-cancelation circuit to correct voltage offset.

24. The computer-readable medium of claim 23, where the control logic is at least partially embodied as instructional logic.

* * * * *